(12) United States Patent
Dallabora et al.

(10) Patent No.: US 6,195,291 B1
(45) Date of Patent: *Feb. 27, 2001

(54) FLASH EEPROM WITH ON-CHIP ERASE SOURCE VOLTAGE GENERATOR

(75) Inventors: Marco Dallabora, Carpiano; Corrado Villa, Sovico; Luigi Bettini, Cavenago Brianza, all of (IT)

(73) Assignee: STMicroelectronics S.r.l., Agrate Brianza (IT)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/687,145

(22) Filed: Jul. 24, 1996

(30) Foreign Application Priority Data

Jul. 24, 1995 (EP) .................................. 95830317

(51) Int. Cl.[7] .................................. G11C 16/06
(52) U.S. Cl. .................. 365/185.23; 365/185.29
(58) Field of Search .............. 365/185.23, 185.29, 365/185.33, 185.14, 185.18, 189.07, 189.09, 218, 189.11

(56) References Cited

U.S. PATENT DOCUMENTS 5,077,691  12/1991  Haddad et al. .................... 365/218
5,412,603 * 5/1995  Schreck ........................ 365/189.01

FOREIGN PATENT DOCUMENTS 0 321 226 A1  6/1989  (EP) .
0 562 737 A2  9/1993  (EP) .

OTHER PUBLICATIONS

"Une Seule Tension de 5V Pour la Flash 16 Mbits," *Electronique* 2045 (42):8, Nov. 1994.

Atsumi et al., "A 16–Mb Flash EEPROM with a New Self–Data–Refresh Scheme for a Sector Erase Operation," *IEICE Transactions on Electronics* e77–c(5):791–798, May 1994.

* cited by examiner

Primary Examiner—A. Zarabian
(74) Attorney, Agent, or Firm—Theodore E. Galanthay; Robert Iannucci; Seed IP Law Group PLLC

(57) ABSTRACT

A Flash EEPROM includes a negative voltage generator for generating a negative voltage to be supplied to control gate electrodes of memory cells for erasing the memory cells. The Flash EEPROM also has a first positive voltage generator for generating a first positive voltage, independent from an external power supply of the Flash EEPROM, to be supplied to source regions of the memory cells during erasing.

27 Claims, 4 Drawing Sheets

FLASH EEPROM WITH ON-CHIP ERASE SOURCE VOLTAGE GENERATOR

TECHNICAL FIELD

The present invention relates to a Flash EEPROM with on-chip erase source voltage generator.

BACKGROUND OF THE INVENTION

It is known that Flash Electrically Erasable and Programmable Read Only Memories (shortly, Flash EEPROMs) have memory cells which are formed by floating-gate MOSFETs. Each floating-gate MOSFET comprises an N type source region and an N type drain region both formed in a spaced-apart condition in a P type semiconductor substrate. The portion of the P type substrate comprised between the source and drain regions forms a channel region, and a floating gate electrode is placed above the channel region with the interposition of a gate oxide layer having thickness of the order of 100 Angstroms. A control gate electrode is insulatively disposed over the floating gate electrode.

A Flash EEPROM memory cell is written by means of injection of hot electrons from a portion of the channel region near the drain region into the floating gate. To activate hot-electron injection, the source region is normally grounded, the control gate electrode is biased with a voltage in the range 9–12 V and the drain region is biased with a voltage in the range 4–7 V. The negative charge trapped in the floating gate increases the threshold voltage of the floating-gate MOSFET, i.e. the minimum voltage that must be applied to the control-gate electrode to determine the formation of an N type inversion layer in the channel region.

Erasure of the Flash EEPROM memory cell is achieved by means of Fowler-Nordheim (F-N) tunneling of electrons from the floating gate to the source region through the gate oxide layer. To activate F-N tunneling, a sufficiently high electric potential difference between the source region and the floating gate must be created, to develop a strong electric field in the gate oxide layer. The known expression of the F-N current is:

$$I_{F-N}=A*Eox^{2}*\exp(-B/Eox) \quad (1)$$

where A and B are constants; Eox is the electric field in the gate oxide layer, given by:

$$Eox=(VS-VFG-\Phi)/Tox \quad (2)$$

where VS is the electric potential applied to the source region, VFG is the electric potential of the floating gate (which is a function of the electric potential of the source and drain regions, of the substrate and of the control gate electrode, and of the charge trapped in the floating gate), $\Phi$ is the voltage drop in the source region and Tox is the gate oxide layer thickness. The F-N current is a measure of the rate at which electrons are extracted from the floating gate: the higher the F-N current, the shorter the erasing time of the memory cell.

As known, in Flash EEPROMs all the memory cells, or at least large groups of them (called sectors), have their respective source regions tied to a common source line. The erasure is thus a global operation simultaneously involving a large number of memory cells.

According to a known technique, the electric potential difference between the source regions and the floating gates of the memory cells necessary to activate F-N tunneling is created by biasing the common source line of the memory cells to be erased with a voltage of approximately 12 V, and keeping the control gate electrodes grounded; the drain regions are instead left floating.

Actually, it is not possible to directly supply the source regions of the memory cells with the whole 12 V potential, because this would cause the junction between the source regions and the substrate (which is tied to ground) to break down. The electric potential actually applied to the source regions must thus be limited to a value suitable to not cause junction breakdown. This limits the F-N current, especially in the final phases of the erasure when the negative charge trapped in the floating gate has become small and its electric potential is less negative. As a consequence, the erasing time of the memory cells becomes quite long. Differently said, the erasing time of the memory cells is limited by the maximum voltage that can be applied to the source regions of the memory cells without causing the breakdown of the source regions-substrate junction.

Another drawback of this technique is that it imposes the use of an external power source for the 12 V potential, in addition to the usual 5 V (or 3 V) external power source. Even if breakdown of the source regions-substrate junction is prevented, the high reverse bias of this junction causes a significant leakage current to flow from the source regions to the substrate, which makes it impracticable the adoption of an on-chip charge pump for generating the 12 V potential.

According to another known technique, described for example in the co-pending European Patent Application No. 95830253.1 filed on Jun. 19, 1995 in the name of the same Applicant, the electric potential difference between the source regions and the floating gates of the memory cells necessary to activate F-N tunneling is created by applying to the control gate electrodes of the memory cells a negative voltage in the range −8 V to −12 V, generated directly on-chip by means of charge pumps, and connecting the common source line of the memory cells to be erased to the VCC pin of the Flash EEPROM. In this way, the source electrode bias voltage is provided by the VCC external supply, and the negative voltage for the control gate can be generated directly on-chip by means of charge pumps. The memory device thus requires a single external supply, i.e. the conventional VCC supply.

A feedback resistor is normally provided in series to the VCC pin and the common source line of the memory cells to be erased, for the reasons explained hereinafter.

The electric field in the gate oxide layer causes the energy bands at the surface of the source regions of the memory cells to bend; if the electric field is sufficiently high, the band bending exceeds the energy bandgap Eg of the semiconductor material (1.2 eV for silicon) and there is a finite probability for electrons in the valence band to tunnel into the conduction band. Electron-hole pairs are thus generated which give rise to a source-to-substrate current (Band-to-Band Tunneling current or BBT current). BBT current is given by:

$$I_{BBT}=C*Esi^{2}*\exp(-D/Esi) \quad (3)$$

where C and D are constants and Esi is the electric field at the surface of the source regions of the memory cells, given by:

$$Esi=(VS-VFG-1.2)/(3*Tox) \quad (4)$$

Equations (1)–(4) show that the F-N current and the BBT current depend in a similar way on the same parameters, so that if in the attempt to reduce the erasing time of the memory cells the F-N current is increased, also the BBT current increases. Moreover, the BBT current is normally several orders of magnitude higher than the F-N current. The feedback resistor allows to limit the source current of the memory cells during erasure, especially in its initial phases when, due to the negative charge trapped in the floating gate, Eox and Esi are maximum and there is a peak in the BBT current. The voltage drop across the feedback resistor, due to the BBT current, limits the electric potential of the source regions of the memory cells, thus limiting the BBT current.

The value of the feedback resistor is chosen on the basis of the maximum allowed source-to-substrate current. At the beginning of erasure, the voltage drop across the feedback resistor is maximum, then as electrons are extracted from the floating gate the potential of the floating gate raises, the electric field in the gate oxide layer decreases and the BBT current diminishes; the voltage drop across the feedback resistor also decreases, and the potential of the source regions of the memory cells raises toward the VCC value. In the final phases of erasure, when the BBT current is low, the potential of the source regions is substantially equal to VCC.

It can be shown that with the feedback resistor, even if the source voltage of the memory cells progressively approaches the VCC value, the electric field in the gate oxide layer of the memory cells lowers as electrons are extracted from the floating gate. This causes an undesired lengthening of the erasing time.

Furthermore, the erasing time of the memory cells is limited by the actual VCC value. The external supply value can vary within a specified range around its nominal value; normally said range is +/−10% of the nominal value. For example, in the most common case of a 5 V nominal external supply, the actual power supply can vary from 4.5 V to 5.5 V. In the case of a 3 V nominal external supply, the actual power supply can be as low as 2.7 V.

SUMMARY OF THE INVENTION

A possible way to overcome the abovementioned problem would be to make the negative voltage of the control gate electrodes more negative. This however could require the adoption of more complicated manufacturing processes, to prevent junction breakdown problems related to the high negative voltages.

In view of the state of art described, it is an object of the present invention to provide a Flash EEPROM requiring a single power supply, suitable to overcome the abovementioned drawbacks. More specifically, the object of the present invention is to provide a Flash EEPROM exploiting the erasing technique described in U.S. Pat. No. 5,659,502, assigned to STMicroelectronics, Srl, but whose erasing time is not limited by the value of the external power supply.

According to the present invention, such object is attained by means of a Flash EEPROM comprising negative voltage generator means for generating a negative voltage to be supplied to control gate electrodes of memory cells for erasing the memory cells, characterized by comprising positive voltage generator means for generating a positive voltage, independent from an external power supply of the Flash EEPROM, to be supplied to source regions of the memory cells during erasing.

Thanks to the present invention, the erasing time of the memory cells is not limited by the value of the external power supply of the Flash EEPROM.

The positive voltage generator means comprises a positive charge pump means which, starting from the external power supply, generates a positive voltage higher than the external power supply, and voltage regulation means associated to said positive charge pump means for regulating the positive voltage generated by the positive charge pump means to provide a positive voltage independent from the value of the external power supply.

The positive charge pump means are electrically equivalent to a voltage generator with a series impedance (the intrinsic output impedance of the charge pump). The voltage regulation means regulates the value of the voltage generator, i.e. the open-circuit value of the voltage generated by the positive charge pump means, so that said open-circuit value is independent from the external power supply. At the beginning of erasing, when the BBT current is maximum, the voltage supplied to the source regions of the memory cells is lower than the open-circuit value of the voltage generated by the charge pump. The output impedance of the charge pump thus limits the source current of the memory cells during erasing. In the final phases of erasing, when the source current of the memory cells is almost zero, the voltage supplied to the source regions of the memory cells approaches the regulated open-circuit value of the voltage generated by the charge pump. Both the regulated open-circuit value of the voltage generated by the charge pump and its output impedance depend on design parameters, and not on the value of the external power supply. It is thus possible to choose the right combination of values for the regulated open-circuit voltage and the output impedance of the charge pump suitable to assure that the electric field in the gate oxide layer of the memory cells remains constant during all the erasing process.

Advantageously, the positive voltage generator means, i.e. the positive charge pump means and the voltage regulation means, can be used to supply a positive voltage to drain regions of the memory cells during programming. This only requires switch means to selectively couple the regulated positive voltage either to the source regions of the memory cells during erasure or to the drain regions of the memory cells during programming.

DETAILED DESCRIPTION OF THE INVENTION

Figure 1:
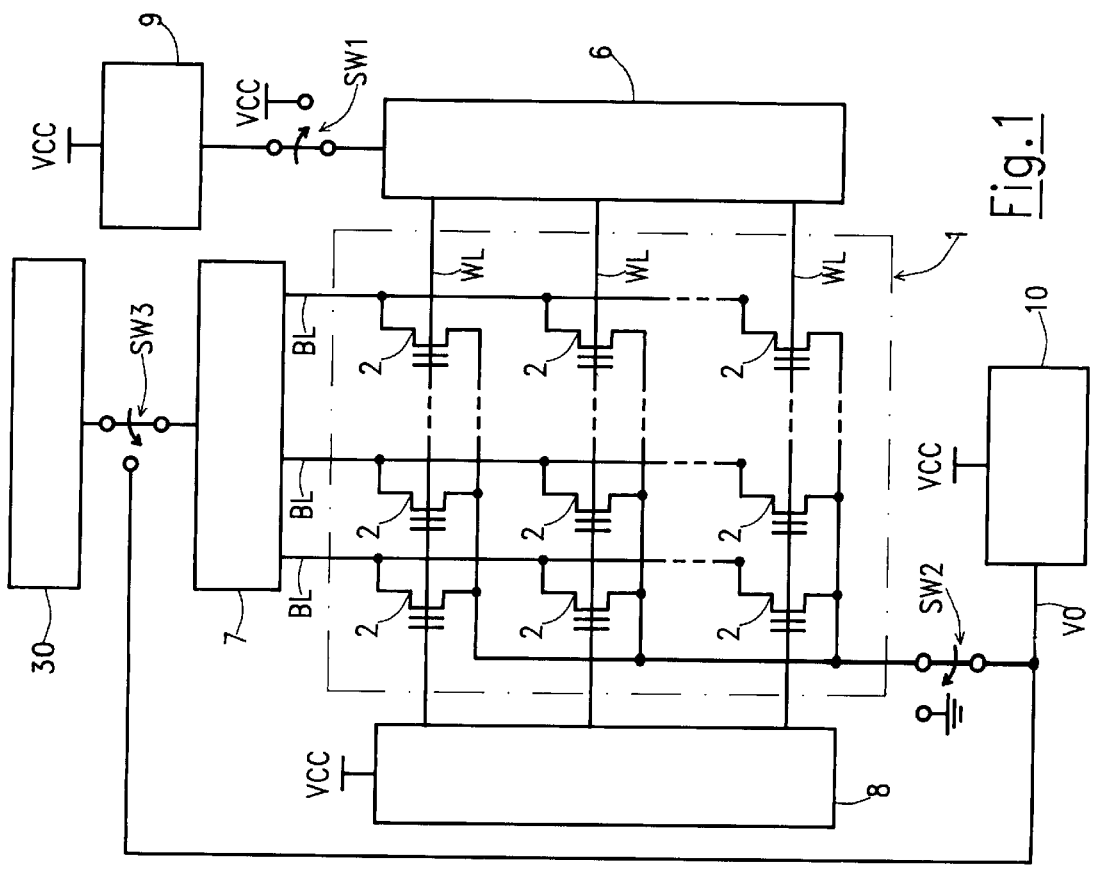
FIG. 1 is a schematic diagram of a Flash EEPROM according to a first embodiment of the present invention.

In FIG. 1 a Flash EEPROM according to the present invention is schematically shown. Conventionally, the Flash EEPROM comprises an array 1 of memory cells 2 arranged in rows (word lines) WL and columns (bit lines) BL.

Figure 6:
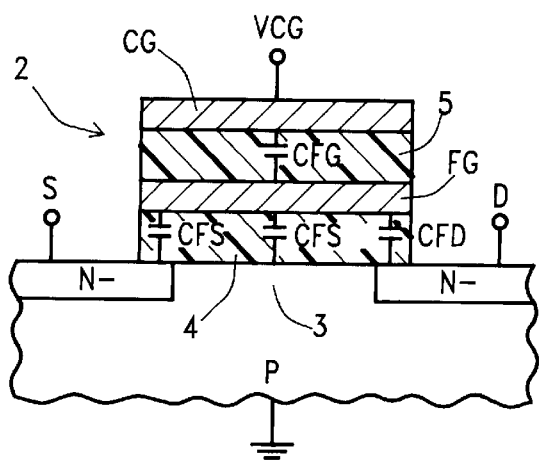
FIG. 6 is a schematic cross-sectional view of a Flash EEPROM memory cell.
Figure 7:
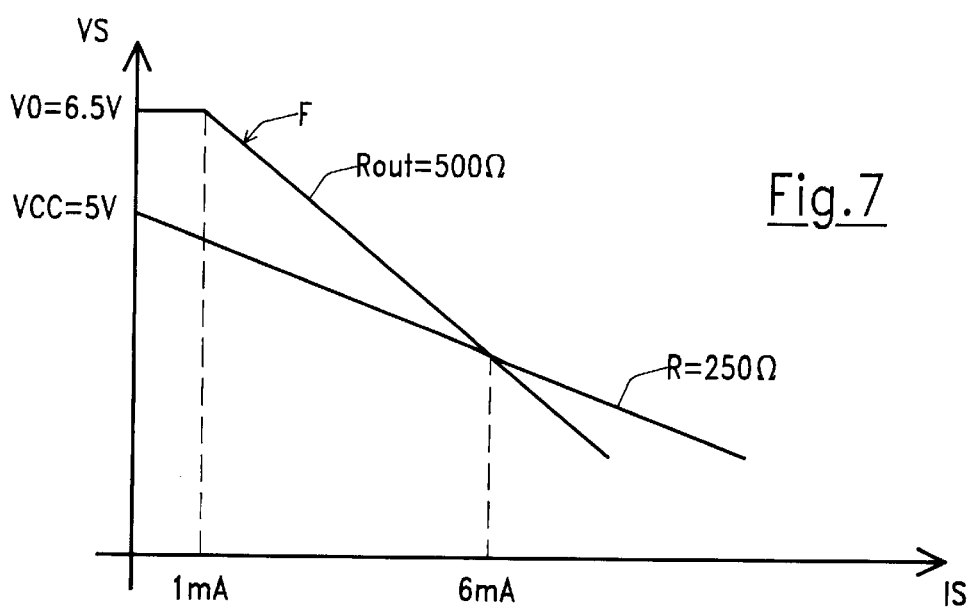
FIG. 7 is a comparative diagram showing the variation of the voltage applied to the source regions of the memory cells during erasing in the case of the prior-art technique and in the case of the present invention.

As shown in FIG. 6, which is a schematic cross-sectional view of a Flash EEPROM memory cell, each memory cell 2 has an N+ drain region D and an N− source region S, both formed in a P type substrate, the source and drain regions being spaced apart to define a channel region 3 therebetween. A floating gate electrode FG is superimposed over the channel region and is insulated therefrom by means of a gate oxide layer 4. A control gate electrode CG is superimposed over the floating gate electrode FG and is insulated therefrom by means of a dielectric layer 5.

In the array 1, each memory cell 2 has the drain region D coupled to a respective bit line BL, the control gate electrode CG coupled to a respective word line WL and the source region coupled to a common source line SL to which the source regions S of all the memory cells are coupled. The array 1 of memory cells can be one sector of the Flash EEPROM; as known, Flash EEPROMs can comprise several sectors of memory cells, and each sector can be erased independently from the others. In a given sector, the memory cells have the source regions commonly connected to a same source line SL, but the common source lines of the different sectors are not connected to each other, to allow independent sector erasing.

Also schematically shown in FIG. 1 are a row decoder 6 and a column decoder 7 which allow the selection of one word line WL and one bit line BL, respectively. The detailed circuit structure of the row and column decoders is not shown, since these circuits are well known to the skilled persons.

The column decoder 7 allows to electrically connect one of the bit lines BL to a sensing circuit 30, also well known to the skilled persons.

The Flash EEPROM of the present invention comprises a negative voltage generator 8 for supplying a negative voltage to the word lines WL during erasing of the array 1 of memory cells. The negative voltage generator 8 can be for example of the type described in the already-cited U.S. Pat. No. 5,659,502 incorporated herein by reference, comprising a negative charge pump circuit designed to generate a negative voltage with values ranging from −8 V to −12 V starting from the voltage provided by an external power supply, indicated in the drawings by VCC. Applicant also incorporates by reference U.S. Pat. No. 5,719,807; U.S. patent application Ser. No. 08/687,145; and U.S. patent application Ser. No. 08/692,936; each assigned to STMicroelectronics, Srl.

The Flash EEPROM also comprises a first positive voltage generator 9 for supplying a high positive voltage to the word lines WL during programming of the memory cells 2. The positive voltage generator 9 can be for example of the type comprising positive charge pump circuits designed to generate a high positive voltage with values ranging from 9 V to 12 V starting from the external power supply VCC. Preferably, the positive voltage generator 9 is designed to generate, in addition to the high positive voltage of 9 V–12 V, a positive voltage of approximately 7 V, useful during the PROGRAM VERIFY phase to perform a margin-mode reading of the programmed memory cells and a positive voltage of approximately 4 V, used during the ERASE VERIFY phase to perform a margin-mode reading of the erased memory cells.

A second positive voltage generator 10 is also provided in the Flash EEPROM. This second positive voltage generator is used for supplying a positive voltage approximately of 5–6 V to the bit lines BL during programming, or a positive voltage of approximately 6–7 V to the common source line SL during erasing. The detailed structure of this positive voltage generator will be described hereinafter.

Also schematically shown in FIG. 1 are switching means SW1, SW2 and SW3. A first switch SW1 allows to switch the voltage supply of the row decoder between the external power supply VCC and the positive voltage generated by the first positive voltage generator 9. A second switch SW2 allows to switch the common source line SL between ground and the output of the second positive voltage generator 10. A third switch SW3 allows to electrically couple the output of the column decoder 7 either to the sensing circuit 30, or to the output of the second positive voltage generator 10.

It appears that the Flash EEPROM of the present invention requires only one external power supply, i.e. the one indicated by VCC. The external power supply VCC is typically a 5 V nominal power supply (actually, 5 V+/−10%, which means that the external power supply can have values in the range 4.5–5.5 V), but could also be a 3 V nominal power supply (3 V+/−10%, i.e. with values in the range 2.7–3.3 V).

In READ mode, the row decoder 6 is supplied by the external power supply VCC (switch SW1 connected to VCC). The row decoder 6 raises the potential of the selected word line WL to VCC, while the potential of all the other word lines is kept to ground. Also, the output of the column decoder 7 is connected to the sensing circuit 30; the selected bit line BL is biased at approximately 1 V, while all the other bit lines are left floating. The common source line SL is tied to ground. The addressed memory cell thus has the VCC value on its control gate electrode CG, approximately 1 V on its drain region D, and 0 V on its source region S.

In PROGRAM mode the positive voltage generator 9 generates a high positive voltage of 9 V–12 V; the row decoder 6 is supplied by the high positive voltage of 9 V–12 V generated by the positive voltage generator 9. The row decoder 6 raises the voltage of the selected word line WL (the one containing the memory cell to be programmed) to the high positive voltage of 9 V–12 V. The second positive voltage generator 10 generates a positive voltage of 5–6 V. The output of the column decoder 7 is connected to the second positive voltage generator 10, so that the potential of the selected bit line BL is raised to the positive voltage of 5–6 V generated by the positive voltage generator 10, while all the other bit lines are left floating. The common source line SL is again tied to ground. The addressed memory cell thus has 9 V–12 V on its control gate electrode CG, a voltage of approximately 5–6 V on its drain region D, and 0 V on its source region S.

In PROGRAM VERIFY mode, the positive voltage generator 9 generates a positive voltage of approximately 7 V. The row decoder 6 is supplied by the positive voltage of 7 v generated by the positive voltage generator 9. The output of the column decoder 7 is connected to the sensing circuit 30, and the common source SL is tied to ground. PROGRAM VERIFY mode is substantially identical to READ mode, except for the fact that the selected word lines are biased at an higher positive voltage (7 V instead of VCC).

In ERASE mode, the row decoder 6 is disabled and the negative voltage generator 8 is activated. All the word lines WL are supplied with the negative voltage generated by the negative voltage generator 8. The column decoder 7 is also deactivated to leave all the bit lines BL floating. The positive voltage generator 10 generates a positive voltage of 6–7 V; the common source line SL is supplied with the positive voltage of 6–7 V generated by the positive voltage generator 10.

In ERASE VERIFY mode, the positive voltage generator 9 generates a positive voltage of approximately 4 V. The row decoder 6 is supplied by the positive voltage of 4 V generated by the positive voltage generator 9. The output of the column decoder 7 is connected to the sensing circuit 30, and the common source line SL is tied to ground.

Figure 2:
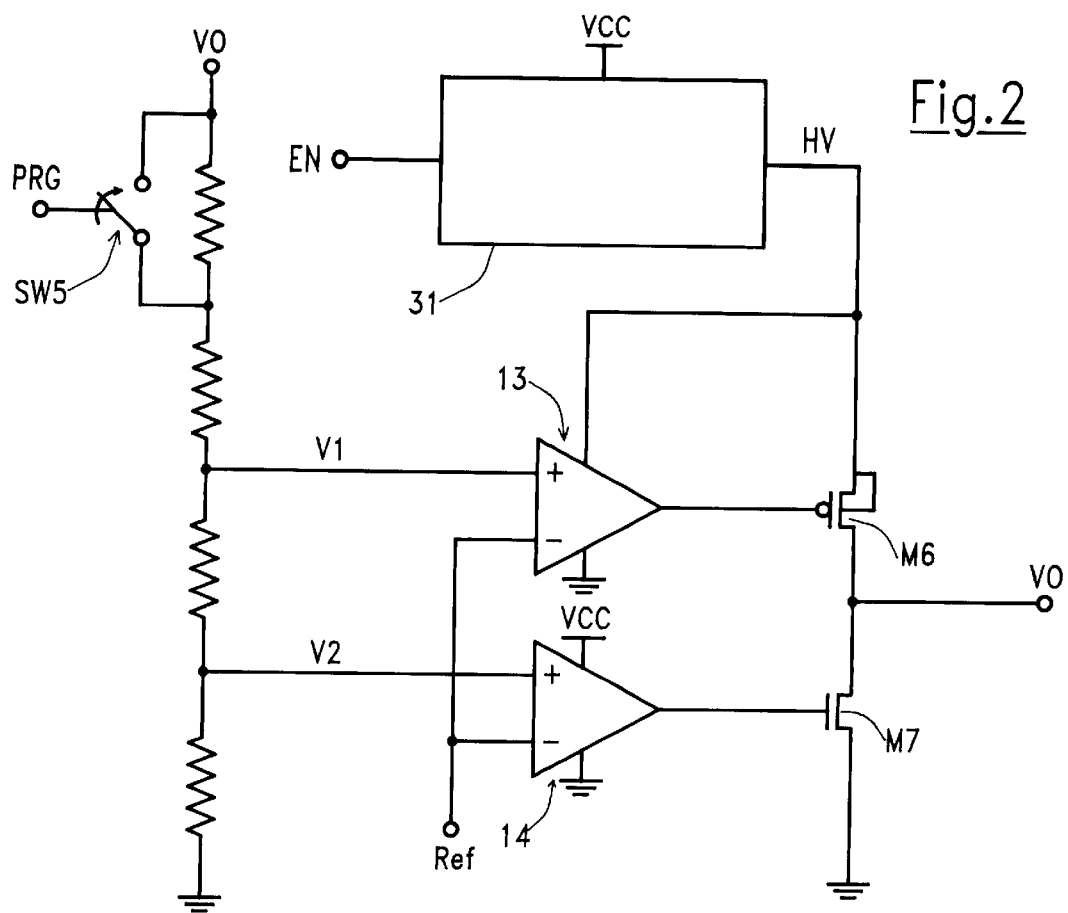
FIG. 2 is a schematic diagram of a positive voltage generator means supplying positive voltage to a common source line of the Flash EEPROM when the latter is operated in ERASE mode.

FIG. 2 show the schematic structure of the positive voltage generator 10. It comprises a positive charge pump 31, shown in detail in FIG. 3, suitable to generate a positive voltage HV higher than the external power supply VCC, and a voltage regulation circuit which provides a positive voltage output VO having a predetermined value of about 5–6 V in PROGRAM mode and of about 6–7 V in ERASE mode, independent from the VCC value.

Figure 3:
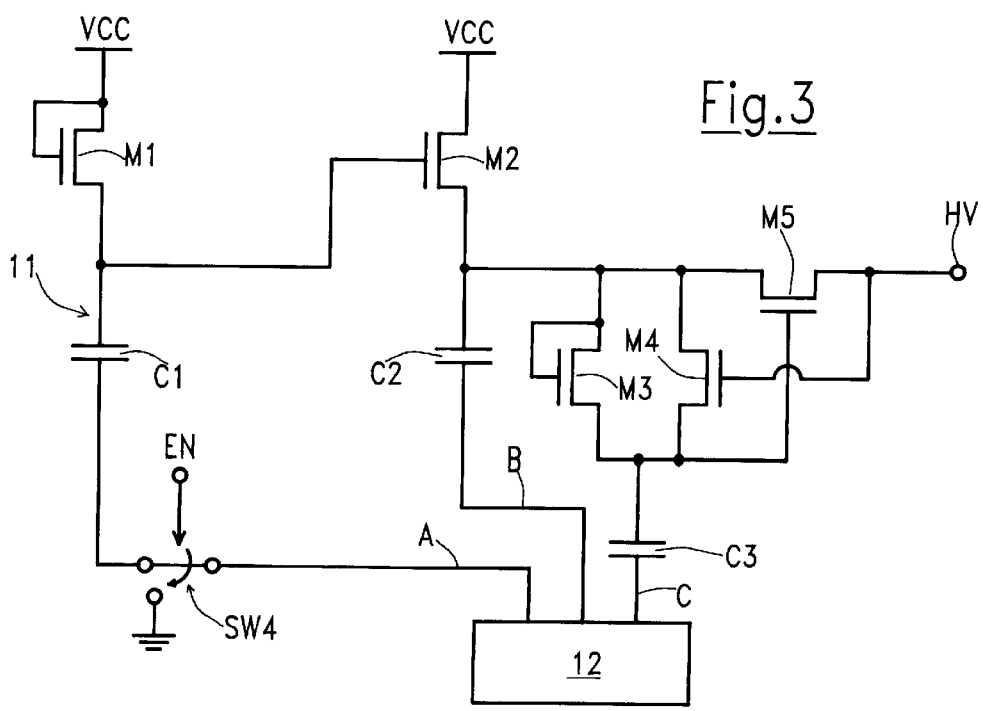
FIG. 3 is a circuit diagram of a positive charge pump included in the positive voltage generator means of FIG. 2.
Figure 4:
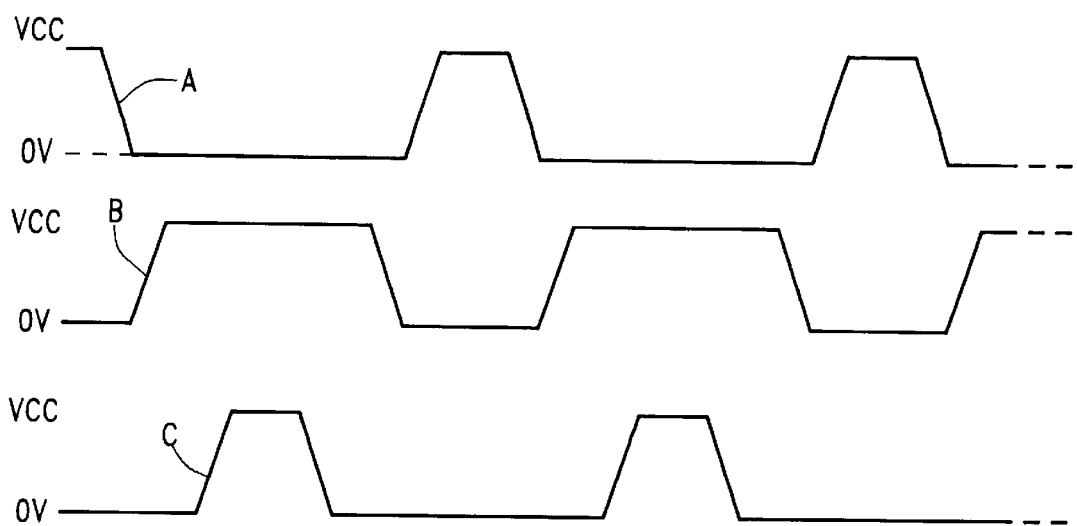
FIG. 4 shows waveforms of driving signals for the positive charge pump of FIG. 3.

The positive charge pump 31 as illustrated in FIG. 3 includes a circuit branch 11 having a diode-connected N-channel MOSFET M1, with drain connected to VCC and source connected to one plate of a capacitor C1. A switch SW4, controlled by an enable signal EN, allows to connect the other plate of C1 either to a first square-wave signal A or to ground. The source of M1 drives the gate of an N-channel MOSFET M2 with drain connected to VCC and source connected to one plate of a capacitor C2; the other plate of C2 is driven by a second square-wave signal B. Also connected to the source of M2 is the drain of a diode-connected N-channel MOSFET M3 with source connected to one plate of a capacitor C3; the other plate of C3 is driven by a third square-wave signal C. An N-channel MOSFET M4 is connected in parallel to M3, and its gate is driven by an output signal HV of the charge pump. An N-channel MOSFET M5 is connected between the drain of M4 and the output signal HV, and its gate is connected to the source of M4. All the MOSFETs M1–M5 are preferably of the low-threshold or native type.

The three square-wave signals A, B and C are generated by a clock generator 12.

When the signal A is low, C1 charges to VCC minus the threshold voltage of M1. Then, when the signal A goes high, the gate voltage of M2 is pumped to a voltage higher than VCC plus the threshold voltage of M2. In this way, the gate voltage of M2 is boosted to let M2 transfer the full VCC value at its source. When the signal B is low, C2 charges to VCC; when the signal B goes high, the voltage on the source of M2 raises to 2*VCC. M3, M4 and C3 allow to boost the gate voltage of M5 to a value sufficient to allow M5 to transfer to the output node HV the full voltage 2*VCC. Actually, the voltage at the output HV is equal to 2*VCC only if the output HV is left open-circuited.

As shown in FIG. 2, the output signal HV supplies a differential amplifier 13 with a first, inverting input connected to a reference voltage Ref (generated for example by a bandgap reference voltage generator not shown) and a second, non-inverting input supplied with a voltage V1 derived by partition from the regulated output voltage VO of the regulation circuit. The output of the differential amplifier 13 drives a P-channel MOSFET M6 with source connected to the output signal HV of the charge pump and drain connected to the regulated output voltage VO. A second differential amplifier 14, supplied by the external power supply VCC, has one input (inverting) connected to the reference voltage Ref and another input (non-inverting) supplied with a voltage V2 also derived by partition from the regulated output voltage VO. The output of the second differential amplifier 14 drives an N-channel MOSFET M7 with drain connected to the regulated output voltage VO and source connected to ground.

If the regulated output voltage VO becomes too high, the output of the first differential amplifier 13 raises towards HV, thus making M6 less conductive. At the same time, the output of the second differential amplifier 14 raises towards VCC, thus making M7 more conductive; this determines a decrease of VO. If differently VO becomes too low, the output of the first differential amplifier 13 lowers towards ground, thus making M6 more conductive. At the same time, the output of the second differential amplifier 14 lowers towards ground, thus making M7 less conductive; this determines an increase of VO.

As visible in FIG. 2, a switch SW5 controlled by a signal PRG activated during programming allows to vary the ratio between V1 and V2 and V0. In this way, the regulated output voltage V0 can have two different values, i.e. 5–6 V in PROGRAM mode and 6–7 V in ERASE mode.

As known, a charge pump circuit is electrically equivalent to a voltage generator with a series output resistance. The voltage generator has a value equal to the open-circuit voltage output of the charge pump circuit, in the present case 2*VCC. The output resistance is a function of the number of stages, of the capacitances of the charge pump and of the frequency of the square-wave signals A, B and C.

Figure 5:
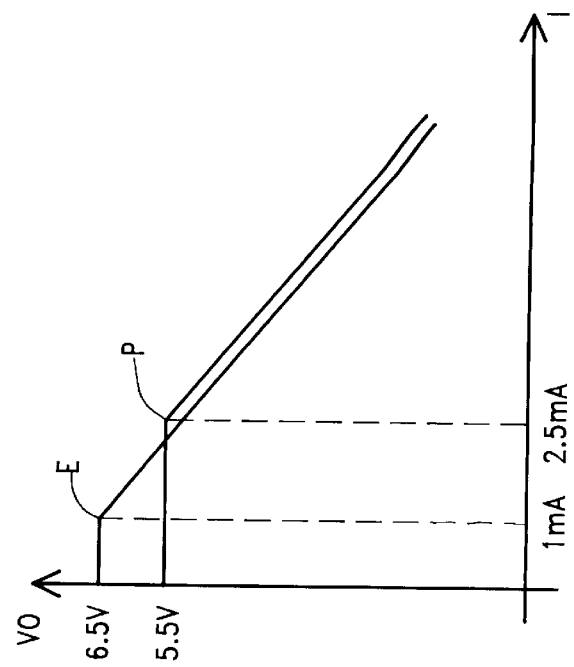
FIG. 5 shows the output characteristics of the positive voltage generator means of FIG. 2.

Referring to FIG. 5, the piece-wise linear characteristics E and F are possible practical output characteristics of the positive voltage generator 10. It has been assumed that the values of the regulated output voltage V0 are 5.5 V in PROGRAM mode and 6.5 V in ERASE mode. It is possible to see that the regulated output voltage V0 remains equal to the regulated open-circuit values of 5.5 V and 6.5 V, independent of VCC, while the current which the charge pump 31 is requested to deliver is lower than approximately 2.5 mA and 1 mA, respectively. For higher currents, V0 decreases linearly with a slope equal to the output resistance of the charge pump circuit.

As shown in FIG. 5, the floating gate electrode FG of a Flash EEPROM memory cell is electrically coupled to the control gate electrode CG, to the source and drain regions S and D and to the substrate through respective capacitors $C_{FG}$, $C_{FS}$, $C_{FD}$ and $C_{FSub}$. As previously mentioned, the potential of the floating gate depends on the negative charge trapped therein, and on the potentials of the control gate, of the drain, of the source and of the substrate. Since the substrate is normally kept to ground and, in ERASE mode, the drain region of the cells is left floating, the potential of the floating gate is given by:

$$VFG = \alpha CG * VCG + \alpha S * VS + Q/CT$$

where $C_T = C_{FG} + C_{FS} + C_{FD} + C_{Sub}$, $\alpha CG = C_{FG}/C_T$, $\alpha S = C_S/C_T$ and Q is the charge trapped in the floating gate; practical values of $\alpha$ CG and $\alpha$ S are 0.6 and 0.2, respectively (it should be understood that these values are given only by way of example, since they depend on the geometry of the memory cells, on the thickness of the oxide layers, and so on). Also, it can be shown that the term Q/CT is equal to $-\alpha CG * \Delta VT$, where $\Delta VT$ is the threshold voltage difference between a programmed memory cell and an erased one.

The difference between the potential of the source region and that of the floating gate is thus given by:

$$VS - VFG = \alpha CG * (\Delta VT - VCG) + (1 - \alpha S) * VS$$

and this potential difference is related to the electric field in the gate oxide, Eox, by the equation:

$$Eox * Tox = VS - VFG.$$

Making reference to FIG. 6, and using the previous equations, the advantages of the present invention will be now made apparent by means of a comparative example.

According to the prior art technique, during erasing the source regions of the memory cells are tied to VCC by means of a series feedback resistor R. Assuming that VCC=5 V, VCG=−8 V and that initially ΔVT=3 V, experimental tests that the applicant has conducted in a practical case have revealed that when using a feedback resistor R=250 MOhm per memory cell (which means 250 Ohms per million of memory cells), the maximum source current sunk by a memory cell is approximately 6 nA (the source current IS per million of memory cells is equal to 6 mA). As previously noted, these valves are only illustrative of a possible practical case, but can vary according to the characteristics of the memory cells. At the beginning of erasing, the voltage drop across the feedback resistor is thus approximately 1.5 V, and VS=3.5 V; the potential difference between the source region and the floating gate of the memory cells is approximately 10 V. As electrons are extracted from the floating gate, ΔVT decreases, the potential of the floating gate rises and the source current decreases; the voltage drop across the feedback resistor diminishes, and VS raises towards VCC. In the final phases of erasing, ΔVT and the source current are approximately zero, VS=5 V (actually, the source current never vanishes, so that the actual source potential at the end of erasing is approximately 4.75 V), and the potential difference between the source region and the floating gate of the memory cells is approximately 8.8 V (8.55 V). It appears that as the erasing proceeds, even if the source potential raises towards VCC, the electric field in the gate oxide layer decreases, and this causes a lengthening of the erasing time.

If moreover the external power supply VCC is lower than its nominal value, for example VCC=4.5 V, the potential difference between the source region and the floating gate of the memory cells is even lower, and this causes a further lengthening of the erasing time.

According to the present invention, the positive voltage generator 10 is designed such that the maximum value (open-circuit value) of the regulated output voltage VO is for example 6.5 V and that the output resistance Rout of the charge pump is for example 500 Ohms per million of memory cells. Experimental tests conducted by the applicant in the same practical case previously mentioned have revealed that the maximum source current of a memory cell is again 6 nA (6 mA per million of memory cells). At the beginning of erasing the potential difference between the source region and the floating gate of the memory cells is approximately 10 V, as in the previous case. However, this voltage difference remains constant during the erasing process: at the end of erasing, when ΔVT=0 and the source current is zero, VS=6.5 V, and the potential difference between the source regions and the floating gates is again 10 V. Thanks to this, the erasing time is shorter than in the previous case. Moreover, even if the value of the power supply lowers to 4.5 V, the erasing time is not negatively affected, because the regulated output voltage VO is independent on the external power supply.

Figure 8:
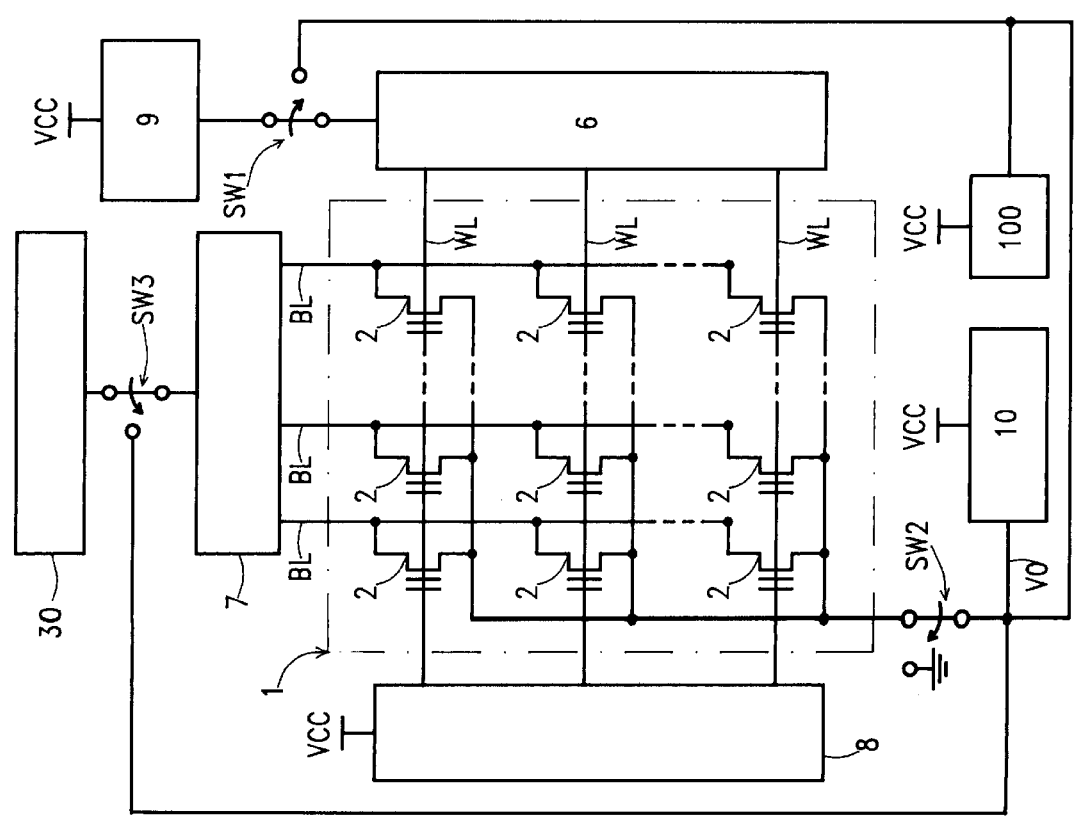
FIG. 8 is a schematic diagram of a Flash EEPROM according to a second embodiment of the present invention.

FIG. 8 is a schematic diagram of a Flash EEPROM according to a second embodiment of the present invention, particularly suitable for a Flash EEPROM designed to operate with a 3 V nominal external power supply.

As visible, the power supply for the row decoder 6 in READ mode is not the external power supply VCC, but is instead the positive voltage VO generated by the second positive voltage generator 10. In this way, if for example the second positive voltage generator 10 is operated to generate, in READ mode, a positive voltage of 5–6 V (as the positive voltage generator 10 does in PROGRAM mode), the potential to which the row decoder 6 raises the selected word line is independent of the external power supply VCC. This allows to reduce the access time of the Flash EEPROM, especially when the Flash EEPROM is designed to operate with a 3 V external power supply.

A possible disadvantage is that when the Flash EEPROM is put in stand-by (low power consumption mode) the positive voltage generator 10 must be deactivated; this means that when a READ operation must be performed, it is necessary to wait for the activation of the positive voltage generator 10 (the output HV of the positive charge pump 31 takes a significant time to reach its steady-state value); this would cause the access time of the Flash EEPROM from stand-by to be quite long.

Figure 9:
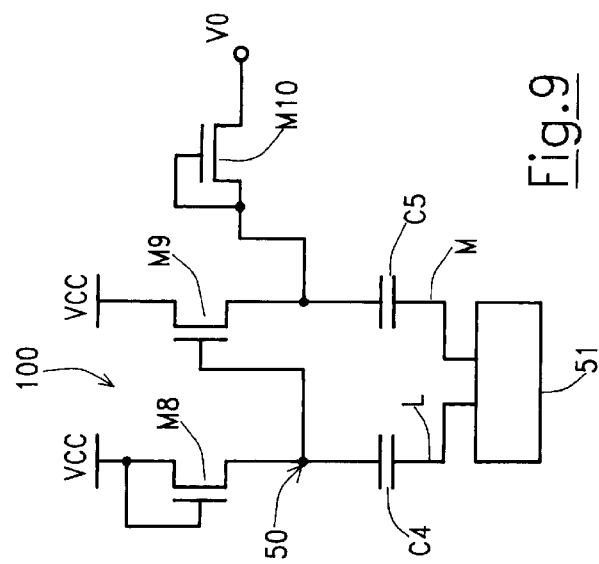
FIG. 9 is a circuit diagram of a stand-by positive charge pump included in the Flash EEPROM of FIG. 8.

To overcome this problem, it is possible to provide a low-consumption stand-by charge pump 100, shown in detail in FIG. 9, which is always active, also when the Flash EEPROM is put in stand-by. The stand-by charge pump 100 keeps the output voltage VO of the positive voltage generator 10 at approximately 5–6 V also when the Flash EEPROM is in stand-by, so that at the first READ operation it is not necessary to wait for the positive voltage generator 10 to reach steady-state.

A possible detailed structure of the stand-by charge pump 100 is shown in FIG. 9. The stand-by charge pump 100 comprises a circuit branch comprising a diode-connected N-channel MOSFET M8 with drain connected to the external power supply VCC and source connected to one plate of a capacitor C4; the other plate of C4 is driven by a first square-wave signal L. The source of M8 drives an N-channel MOSFET M9 with drain connected to VCC and source connected to one plate of a capacitor C5 whose second plate is driven by a second square-wave signal M. The source electrode of M9 is connected to the drain electrode of a diode-connected N-channel MOSFET M10 whose source is connected to the positive output voltage VO of the positive voltage generator 10. The two square-wave signals L, M are substantially 180° out-of-phase, and are generated by a clock generator 51.

The stand-by charge pump 100 is dimensioned to supply a current which is sufficient to compensate the leakage currents of the row decoder 6 during stand-by. Therefore, the stand-by charge pump has a low power consumption.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. On an integrated circuit chip, a flash EEPROM circuit comprising:

a voltage terminal for accepting an off-chip generated voltage produced by an external power supply;

a negative voltage generator including a charge pump coupled to control gate electrodes of memory cells, the negative voltage generator for generating a negative voltage to be supplied to the control gate electrodes of the memory cells for erasing the memory cells; and a first positive voltage generator including a charge pump coupled to source regions of the memory cells, the first positive voltage generator generating a first positive voltage having a higher voltage value than the off-chip generated voltage, to be supplied to the source regions of the memory cells during erasing.

2. The flash EEPROM according to claim 1 wherein said charge pump of the first positive voltage generator generates a second positive voltage higher than the external power supply, and wherein the first positive voltage generator further comprises a voltage regulator that regulates the second positive voltage to provide the first positive voltage, the first positive voltage being independent of the off-chip generated voltage.

3. The flash EEPROM according to claim 2 wherein said voltage regulator comprises a first operational amplifier comparing a first comparison voltage derived from the first positive voltage with a reference voltage and controlling the conduction state of pull-up means coupling said first positive voltage to said second positive voltage, and a second operational amplifier comparing a second comparison voltage derived from the first positive voltage with the reference voltage and controlling the conduction state of pull-down means coupling the first positive voltage to a ground voltage.

4. The flash EEPROM according to claim 3 further including first switch means for alternatively coupling the source regions of the memory cells to said first positive voltage during erasing, or to a ground voltage during reading of the memory cells.

5. The flash EEPROM according to claim 4 further comprising:
a second positive voltage generator coupled to the control gate electrodes of the memory cells and generating a third positive voltage to be supplied to the control gate electrodes of the memory cells for programming the memory cells; and
second switch means for alternatively coupling said first positive voltage to a drain region of a selected one of the memory cells during programming of the selected memory cell or said drain region of the selected memory cell to a sensing circuit during reading of the selected memory cell.

6. The flash EEPROM according to claim 5 wherein the first positive voltage generated by the first positive voltage generator has a first value during erasing of the memory cells, and a second value during programming of the memory cells.

7. The flash EEPROM according to claim 6 wherein said voltage regulator further includes voltage partition means for providing the first comparison voltage and the second comparison voltage proportional to the first positive voltage, the first comparison voltage being compared by the first operational amplifier with the reference voltage and the second comparison voltage being compared by the second operational amplifier with the reference voltage.

8. The flash EEPROM according to claim 7 wherein said voltage partition means further includes means for changing a proportionality factor between the first comparison voltage and the first positive voltage and between the second comparison voltage and the first positive voltage, to vary the value of the first positive voltage between said first value during erasing and said second value during programming.

9. The flash EEPROM according to claim 8 wherein said external power supply supplies the control gate electrodes of the memory cells during reading of the memory cells.

10. The flash EEPROM according to claim 9 further including third switch means for alternatively coupling the control gate electrodes of the memory cells either to said external power supply during reading of the memory cells, or to said second positive voltage generator means during programming of the memory cells.

11. The flash EEPROM according to claim 9 further including low-consumption positive charge pump coupled to the first positive voltage generator and structured to keep the first positive voltage biased at a prescribed potential when the Flash EEPROM is in a stand-by condition in which the first positive voltage generator is deactivated.

12. An integrated circuit including a flash EEPROM comprising:
a memory cell having a word line, a bit line and a source line;
a column decoder coupled to said bit line;
a negative voltage generator selectively coupled to said word line;
a row decoder coupled to said word line; and
a first positive voltage generator coupled to said memory cell and having a control output, wherein said first positive voltage generator control output selectively supplies said source line, during an erasing function, with a first positive voltage pumped from and higher than a voltage supplied to the chip by an external power supply.

13. The Flash EEPROM of claim 12 wherein said first positive voltage generator further includes:
a positive charge pump coupled to said external power supply, said positive charge pump providing a second positive voltage greater than a voltage provided by said external power supply; and
a regulation circuit coupled between said positive charge pump and said control output, wherein said regulation circuit regulates the second positive voltage generated by the positive charge pump to provide said first positive voltage independent from said external power supply.

14. The Flash EEPROM of claim 13 wherein said regulation circuit further includes:
a first comparator circuit coupled between said positive charge pump and a reference voltage and having a first comparison input, a first reference input and a first output, said first comparison input is coupled to said first positive voltage and said first reference input is coupled to said reference voltage;
a pull-up transistor coupled between said first output, said positive charge pump, and said first positive generator control output, wherein said first comparator circuit compares a signal on the first comparison input with a signal on the first reference input and regulates the conduction state of said pull-up transistor by coupling said first positive voltage to said second positive voltage;
a second comparator circuit coupled between said external power supply and said reference voltage and having a second comparison input, a second reference input, and a second output, said second comparison input is coupled to said first positive voltage and said second reference input is coupled to said reference voltage; and
a pull-down transistor coupled between said second output, said reference voltage, and said first positive generator control output, wherein said second comparator circuit compares a signal on the second comparison input with a signal on the second reference input and regulates the conduction state of said pull-down transistor by coupling the first positive voltage to a ground potential.

15. The Flash EEPROM of claim 14 wherein said first positive voltage of said first positive voltage generator generates a first value during erasing of the memory cell, and a second value during programming of the memory cell.

16. The Flash EEPROM of claim 15 wherein said regulation circuit further includes a voltage partition circuit providing the first comparison voltage and the second comparison voltage proportional to the first positive voltage, and wherein said regulation circuit changes a proportionality factor between the first comparison voltage and the first positive voltage and between the second comparison voltage and the first positive voltage, to vary the value of the first positive voltage between said first value during erasing and said second value during programming.

17. The Flash EEPROM of claim 14 further including:
 a first switch that selectively couples said first positive voltage to said source line during erasure of said memory cell, and selectively couples said ground potential to said source line during reading of said memory cell;
 a second switch that selectively couples said first positive voltage to said column decoder during programming, and selectively couples said column decoder to a sensing circuit during reading of the memory cell; and
 a third switch that selectively couples said word line to said external power supply line during reading, and selectively couples said word line to a second positive voltage generator during programming of said memory cell.

18. The Flash EEPROM of claim 12, further including a negative voltage generator coupled to the row decoder.

19. A flash EEPROM device comprising:
 a plurality of memory cells each including a drain terminal, a gate terminal, and a source terminal;
 a common source line coupled to two or more source terminals;
 a bit line coupled to one or more drain terminals;
 a negative voltage generator having an output and being structured to generate a voltage other than an external voltage supplied to the flash EEPROM device, the negative voltage generator coupled to one of the gate terminals during an erase function; and
 a first positive voltage generator having an output and structured to generate a voltage higher than an external voltage supplied to the flash EEPROM device, the output of the first positive voltage generator coupled to the common source line during the erase function and coupled to one of the bit lines during a program function.

20. The flash EEPROM device of claim 19 further including:
 a second positive voltage generator having an output and structured to generate a voltage higher than the external voltage supplied to the flash EEPROM device, the second positive voltage generator coupled to one of the gate terminals during the program function.

21. The flash EEPROM device of claim 19 wherein the first positive voltage generator further comprises a voltage regulator.

22. The Flash EEPROM device of claim 21 wherein said voltage regulator further includes:

a first comparator circuit coupled between a charge pump and a reference voltage and having a first comparison input, a first reference input and a first output, the first comparison input coupled to the first positive voltage generator output and the first reference input coupled to the reference voltage;
 a pull-up transistor coupled between the first output, the charge pump, and the first positive voltage generator output, the first comparator circuit being structured to compare a signal on the first comparison input with a signal on the first reference input and regulate the conduction state of the pull-up transistor by coupling the first positive voltage generator to the output of the charge pump;
 a second comparator circuit coupled between an external power supply and the reference voltage and having a second comparison input, a second reference input, and a second output, the second comparison input coupled to the first positive voltage generator output and the second reference input coupled to the reference voltage; and
 a pull-down transistor coupled between the second output, the reference voltage, and the first positive generator output, the second comparator circuit being structured to compare a signal on the second comparison input with a signal on the second reference input and regulate the conduction state of the pull-down transistor by coupling the first positive voltage generator output to a ground potential.

23. The flash EEPROM device of claim 19 wherein the voltage that the first positive voltage generator generates is different during the program function than that generated during the erase function.

24. The flash EEPROM device of claim 19 further including a switch structured to alternatively couple one of the gate terminals to the second positive voltage generator during the program function and to the voltage supplied to the flash EEPROM during a read function.

25. The flash EEPROM device of claim 19 further including a switch structured to alternatively couple the common source line to the first positive voltage generator during the erase function and to a ground voltage during the program function.

26. The flash EEPROM device of claim 19 further including a switch structured to alternatively couple one of the drain terminals to the first positive voltage generator during the program function or to a sensing circuit during the erase function.

27. The flash EEPROM device of claim 19 further including a low-power consumption positive charge pump coupled to an output of the first positive voltage generator.

* * * * *